(12) United States Patent
Han et al.

(10) Patent No.: US 12,183,687 B2
(45) Date of Patent: Dec. 31, 2024

(54) SEMICONDUCTOR DEVICE AND METHOD USING AN EMI-ABSORBING METAL BAR

(71) Applicant: STATS ChipPAC Pte. Ltd., Singapore (SG)

(72) Inventors: KyouYong Han, Gyeonggi-do (KR); WonJung Kim, Incheon (KR); WoongHui Park, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 268 days.

(21) Appl. No.: 17/658,240

(22) Filed: Apr. 6, 2022

(65) Prior Publication Data
US 2023/0326872 A1 Oct. 12, 2023

(51) Int. Cl.
*H01L 23/552* (2006.01)
*H01L 21/56* (2006.01)

(52) U.S. Cl.
CPC ................... *H01L 23/552* (2013.01)

(58) Field of Classification Search
CPC ... H01L 23/552; H01L 21/56; H01L 25/0655; H01L 23/5383; H01L 23/49816; H01L 23/3128; H01L 2224/81

USPC .................................................. 257/659, 666
See application file for complete search history.

(56) References Cited

U.S. PATENT DOCUMENTS

| | | | |
|---|---|---|---|
| 5,639,989 A | 6/1997 | Higgins, III | |
| 9,070,793 B2 | 6/2015 | Liao et al. | |
| 10,510,733 B2 | 12/2019 | Kumar et al. | |
| 10,522,475 B2 | 12/2019 | Lee et al. | |
| 10,784,208 B2 | 9/2020 | Liao et al. | |
| 11,889,625 B2 * | 1/2024 | Katsube | H01L 23/49811 |
| 2006/0083948 A1 * | 4/2006 | Kawaguchi | H05K 9/0083 204/192.15 |
| 2016/0276288 A1 * | 9/2016 | Lee | H01L 24/97 |
| 2022/0053631 A1 * | 2/2022 | Kang | H05K 9/0022 |
| 2022/0110211 A1 * | 4/2022 | Katsube | H01L 23/552 |

\* cited by examiner

*Primary Examiner* — Didarul A Mazumder
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate. A first semiconductor die and second semiconductor die are disposed over the substrate. A metal bar has an EMI-absorbing material disposed over the metal bar. The metal bar is disposed over the substrate between the first semiconductor die and second semiconductor die. An encapsulant is deposited over the first semiconductor die, second semiconductor die, and metal bar. A shielding layer is formed over the encapsulant.

21 Claims, 9 Drawing Sheets

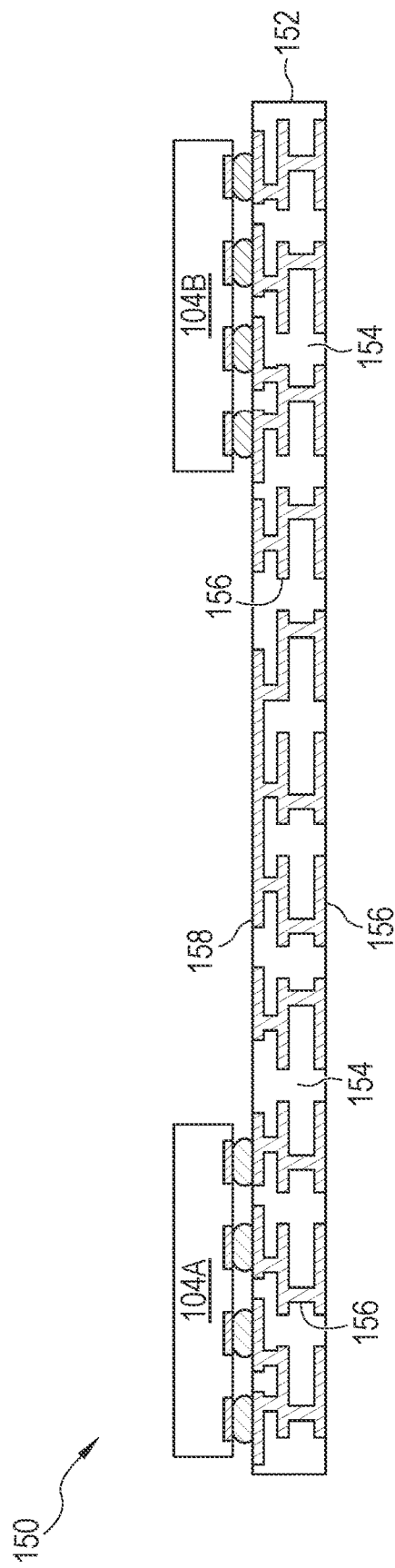
FIG. 2a
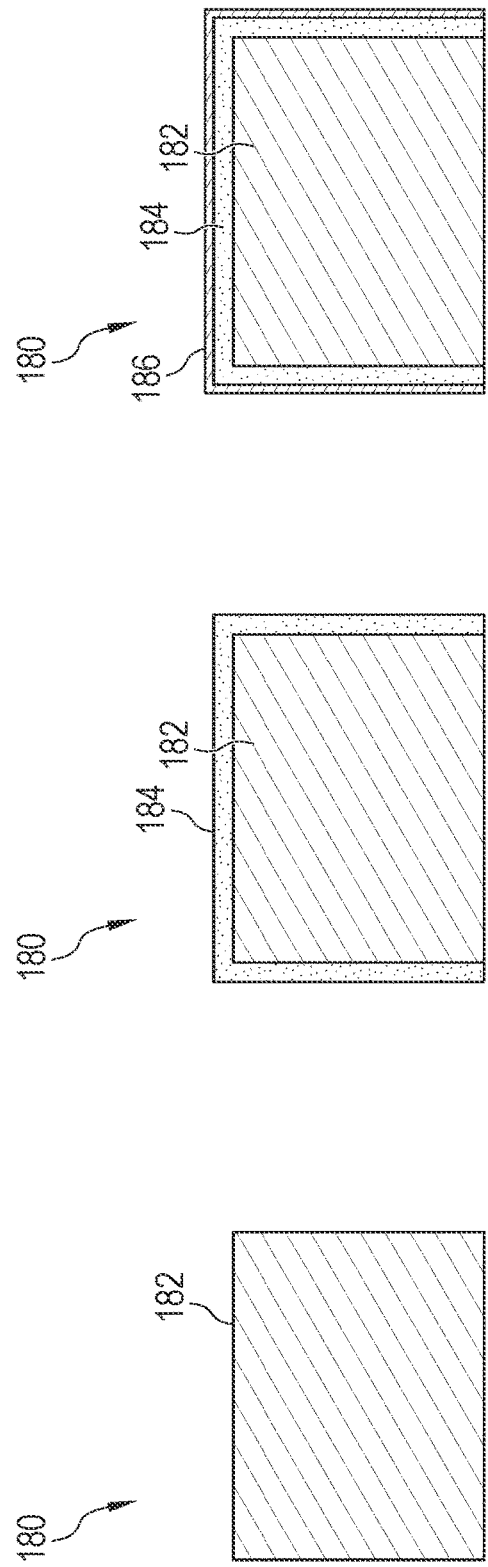
FIG. 2b
FIG. 2c
FIG. 2d

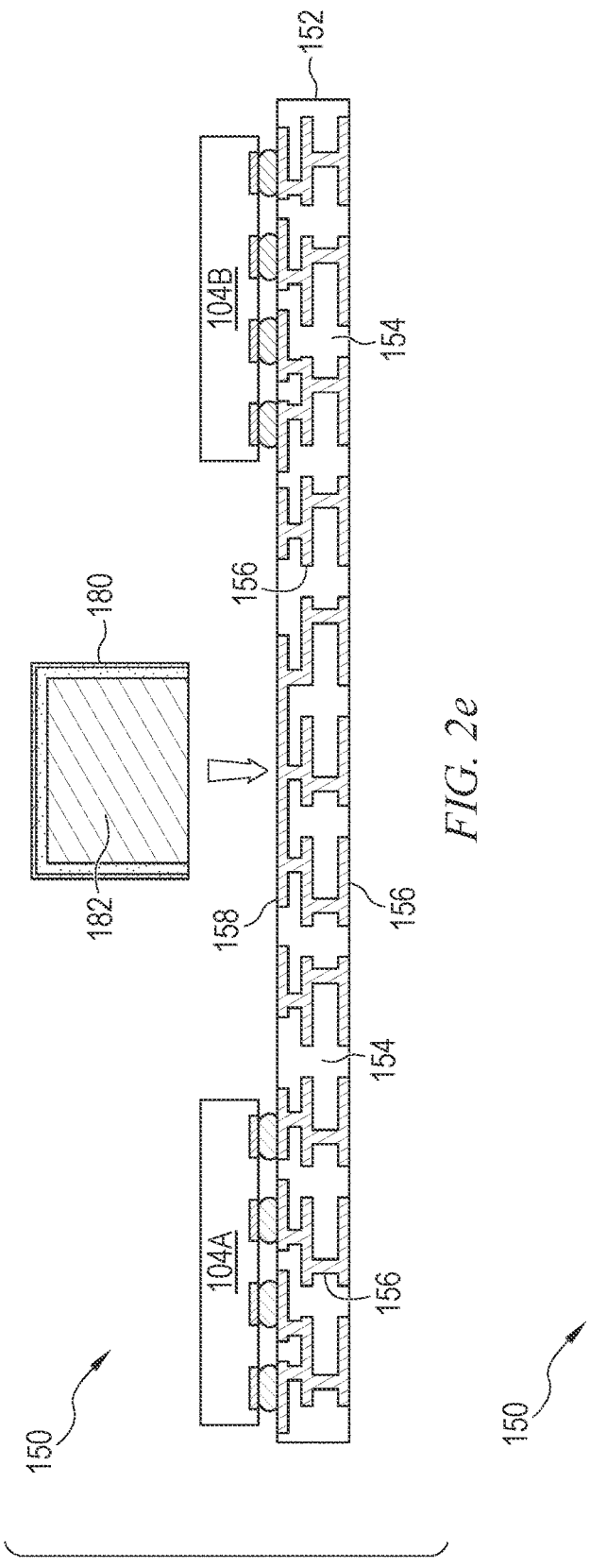
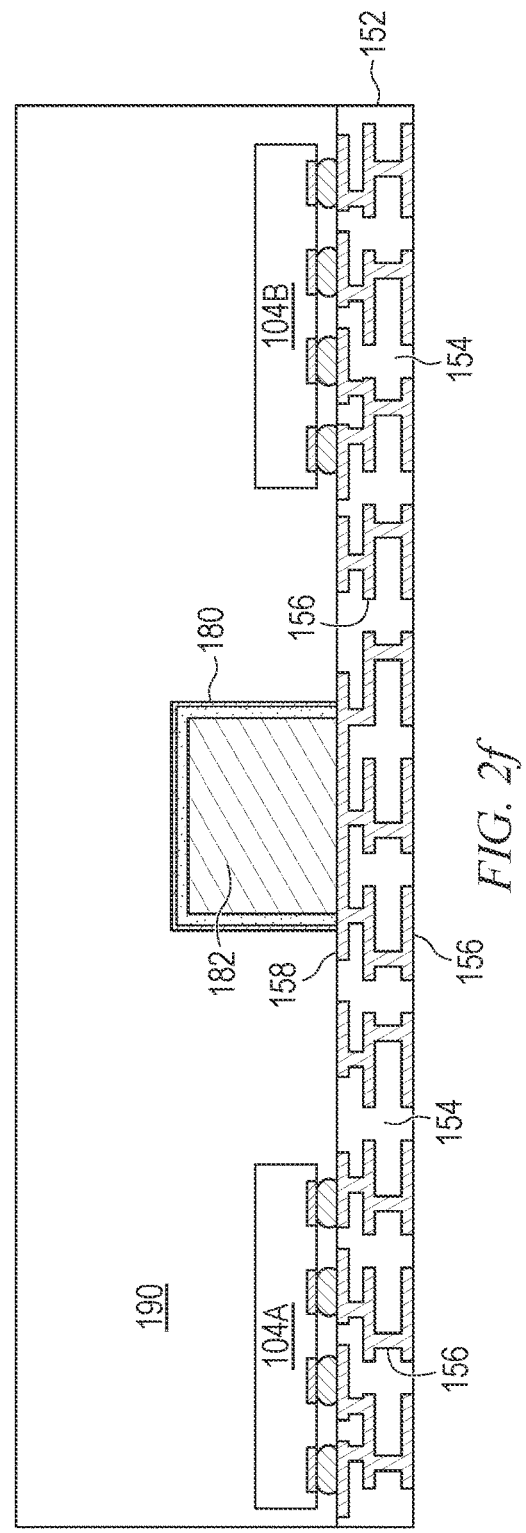

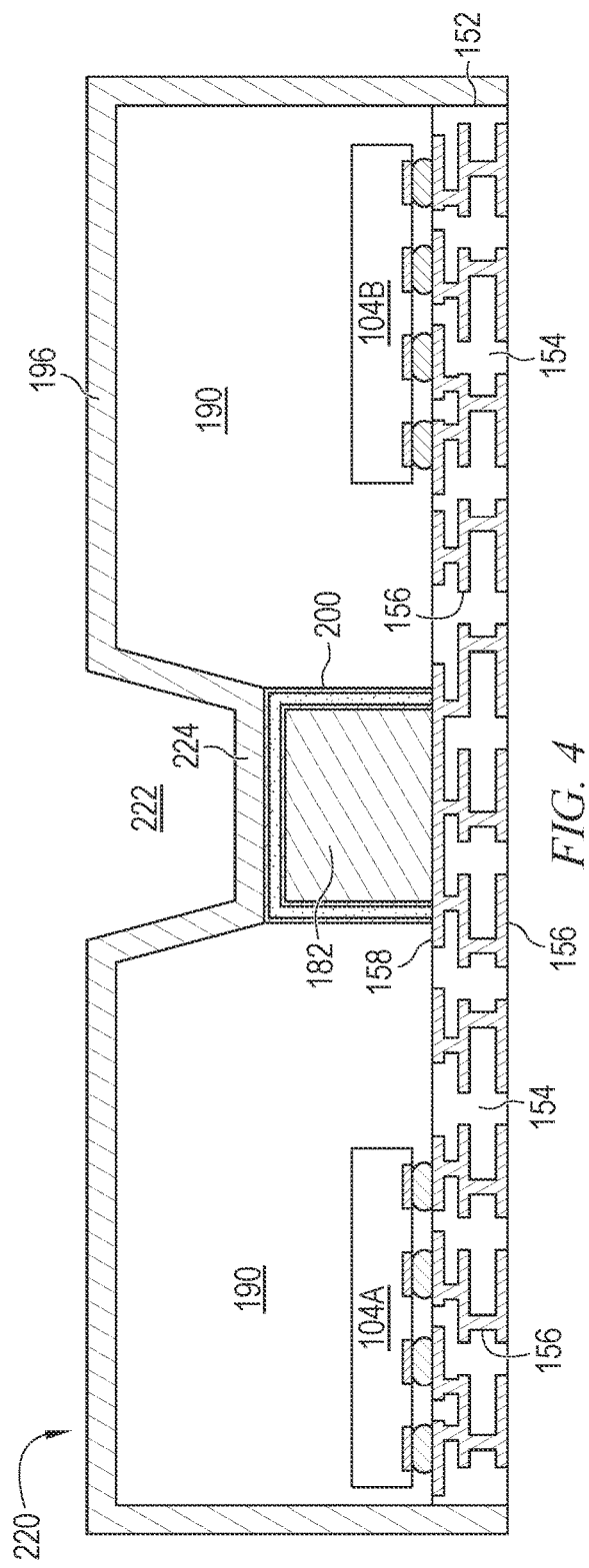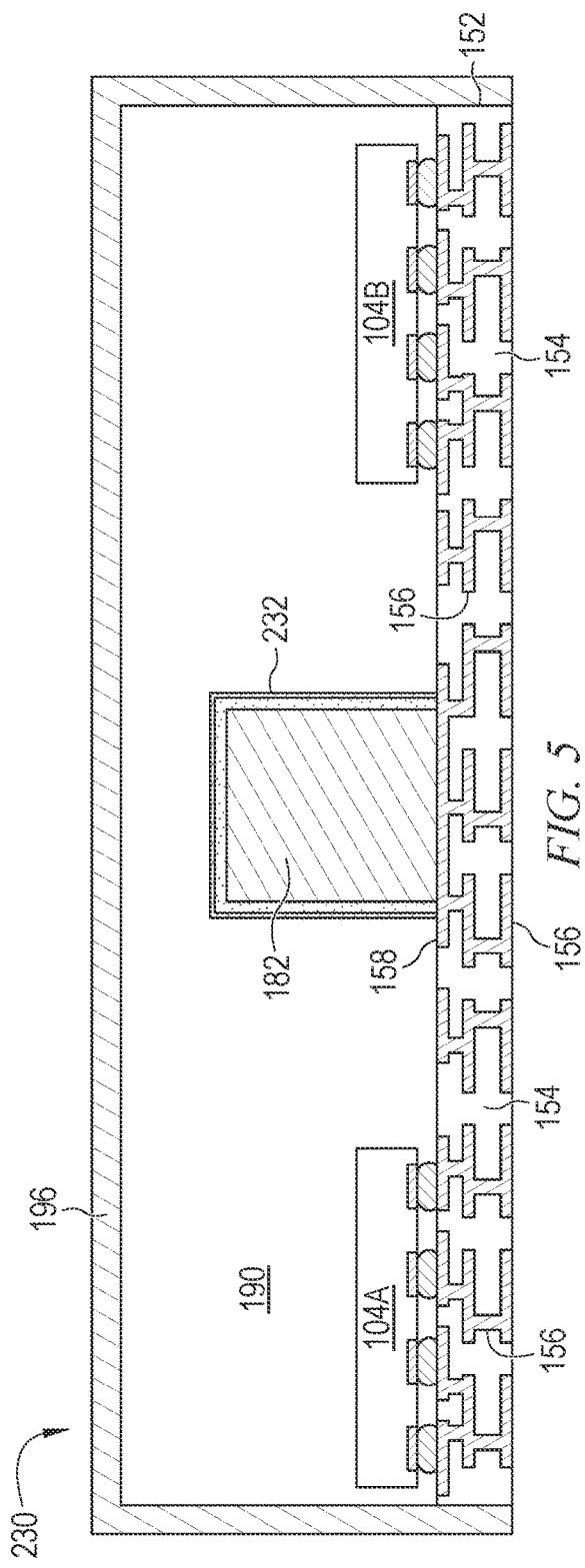

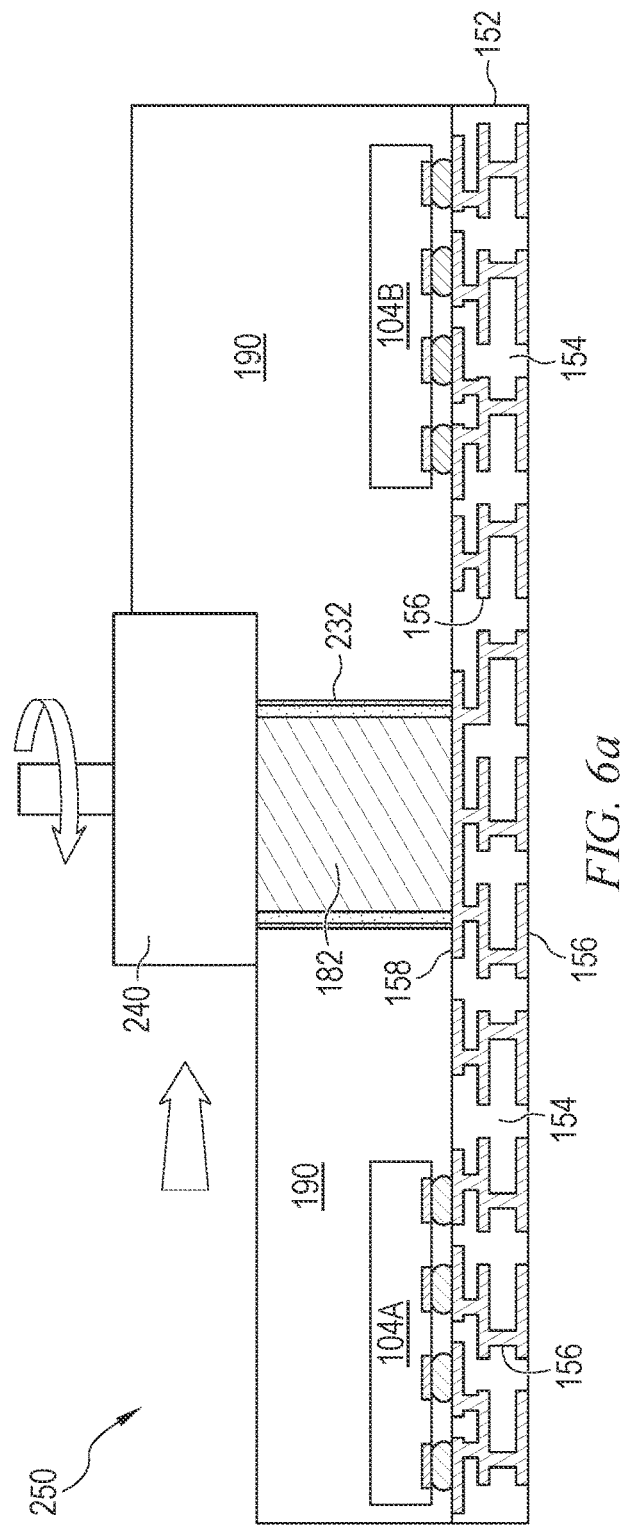
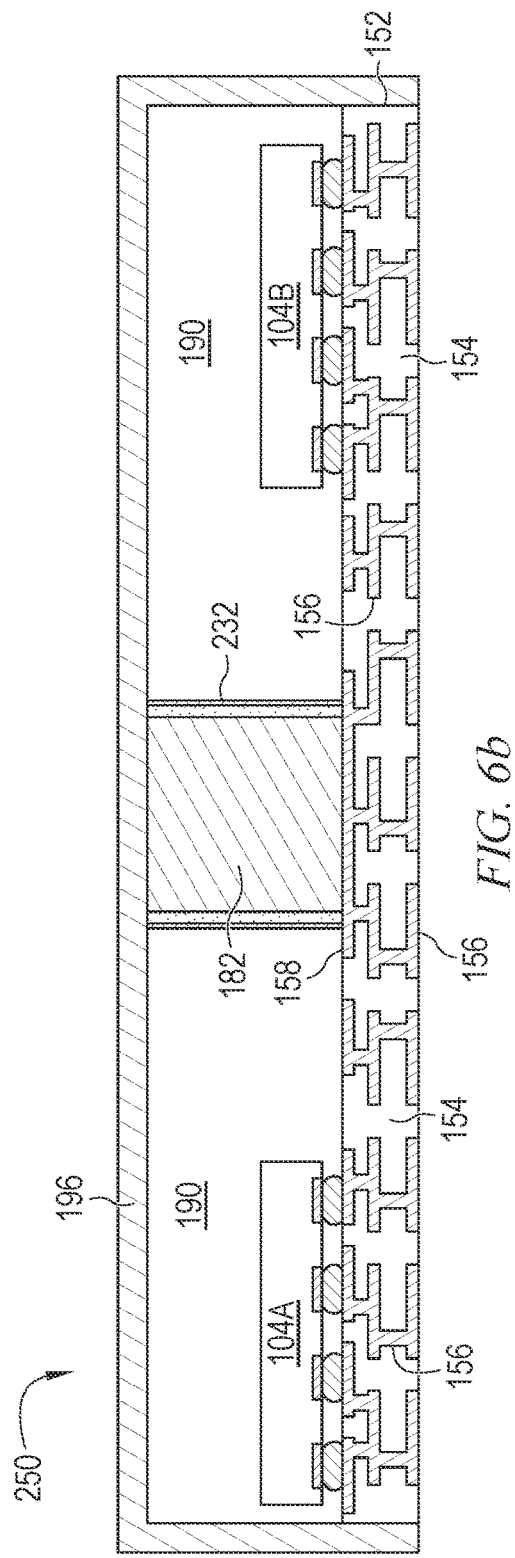

SEMICONDUCTOR DEVICE AND METHOD USING AN EMI-ABSORBING METAL BAR

FIELD OF THE INVENTION

The present invention relates in general to semiconductor devices and, more particularly, to a semiconductor device and method using an electromagnetic interference (EMI) absorbing metal bar.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

EMI shielding is provided to protect from intra-package interference by placing an electrically conductive barrier between adjacent components. The conductive barrier is usually coupled to ground so that EMI radiation between the adjacent components is shunted to ground. However, the electrically conductive barrier can reflect a significant portion of EMI radiation instead of absorbing it. The reflected signals can cause interference within the component that emitted the RF. Therefore, a need exists for an improved device and method for intra-package EMI shielding.

BRIEF DESCRIPTION OF THE DRAWINGS

FIGS. 2a-2g illustrate forming a system-in-package (SiP) module using a metal chip or bar with an EMI-absorbing coating to block and absorb intra-package EMI;

FIG. 4 illustrates a trench formed over the metal bar for extra grounding;

FIG. 5 illustrates varying the height of the metal bar;

FIGS. 6a and 6b illustrate a full-height metal bar; and

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
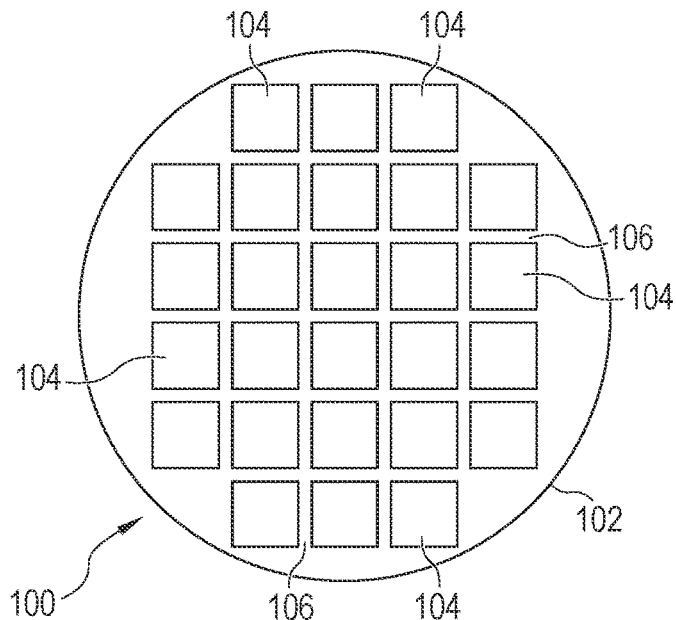
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
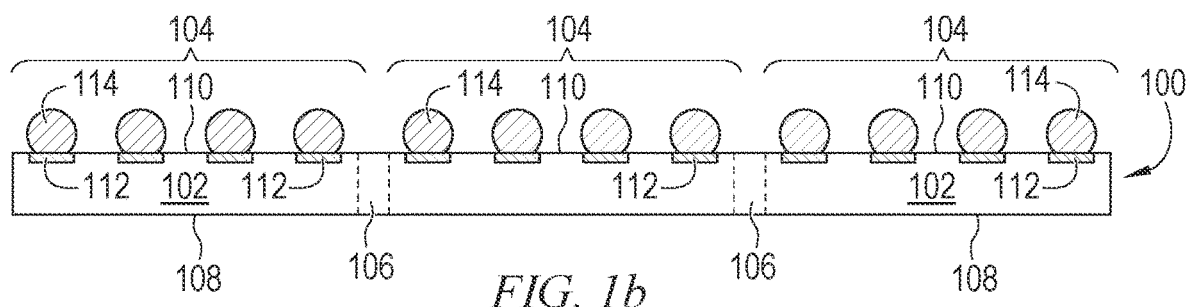

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using physical vapor deposition (PVD), chemical vapor deposition (CVD), electrolytic plating, electroless plating, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1B. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. The bump material can be reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bump, micro bump, conductive pillars, or other electrical interconnect.

Figure 1C:
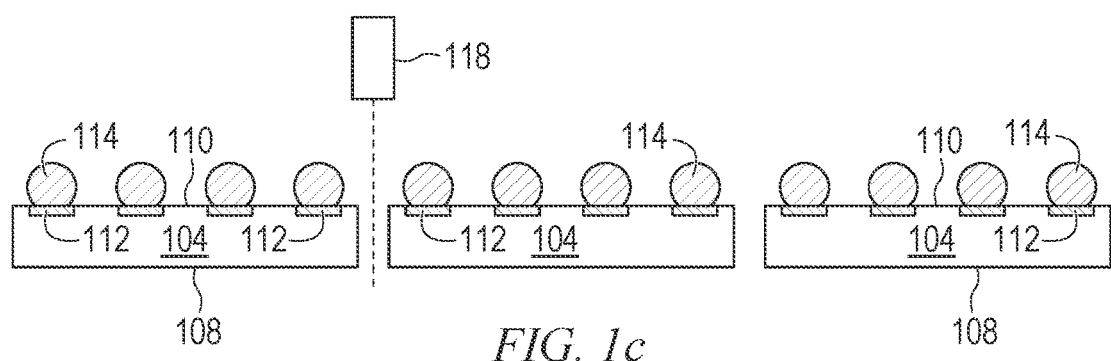

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post-singulation.

FIGS. 2a-2g illustrate forming a system-in-package (SiP) device 150 with multiple semiconductor die 104 and an EMI-absorbing metal chip or bar between the semiconductor die for intra-package electromagnetic interference (EMI) shielding.

FIG. 2a shows a partial cross-sectional view of a substrate 152. While only a single substrate 152 is shown, hundreds or thousands of substrates are commonly processed on a common carrier, using the same steps described herein for a single unit but performed en masse. Substrate 152 could also start out as a single large substrate for multiple units, which are singulated from each other during or after the manufacturing process.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

SiP device 150 in FIG. 2a has had semiconductor die 104a and 104b mounted thereon, as well as any discrete active or passive components, semiconductor die, or other components desired for the intended functionality. A ground contact pad 158 exists to separate two sections of substrate 152. An EMI shield will later be mounted to ground contact pad 158 to protect devices on either side of the ground contact pad from EMI generated by each other. Any type and number of components can be mounted on substrate 152 on either side of grounding pad 158, to which an EMI-absorbing metal bar will be mounted. Solder bumps 114 are reflowed between conductive layers 156 and semiconductor die 104 to mechanically and electrically connect the die to substrate 152. Components can be mounted onto either the top surface of substrate 152 as illustrated in FIG. 2a, the bottom surface, or both, and also embedded within the substrate in any suitable order and configuration.

FIG. 2b shows the beginning of forming an EMI-absorbing metal bar 180. The process begins with a metal bar 182 that is typically cut from a larger sheet of metal or molded into a cubical, trapezoidal, or other desirable shape. Metal bar 182 is formed by depositing metal into a mask opening in other embodiments. Metal bar 182 is most commonly formed from copper, but other materials such as iron, chromium, aluminum, gold, titanium, tungsten, tin, other conductive materials, and combinations or alloys thereof are used in other embodiments.

In FIG. 2c, an EMI-absorbing layer 184 is coated over metal bar 182. In some embodiments, EMI-absorbing layer 184 is formed of a material from the AB5000SHF Series manufactured by 3M. EMI-absorbing layer 184 is typically a polymeric resin base with a magnetic metal flake filler. EMI-absorbing layer 184 is a nickel layer in another embodiment. Nickel is especially suited for embodiments with lower RF frequencies, in the range of about 400 MHz to 1 GHz. Any suitable EMI-absorbing material is used in other embodiments.

EMI-absorbing layer 184 can be deposited as a liquid or powder and then cured or hardened. Alternatively, EMI-absorbing layer 184 is provided as a preformed sheet of material that is disposed onto the surfaces of metal bar 182. EMI-absorbing layer 184 can be applied by sputtering, plating, spraying, or other metal or material deposition techniques when appropriate for the material being used.

The bottom surface of metal bar 182 remains free of EMI-absorbing layer 184 due to the metal bar sitting on a carrier during application of the EMI-absorbing layer. Having the bottom surface of metal bar 182 exposed provides a convenient surface for attachment of EMI-absorbing metal bar 180 to substrate 152 using solder. In other embodiments, all surfaces of metal bar 182 are coated in EMI-absorbing material 184.

In FIG. 2d, a protection layer 186 is formed over EMI-absorbing material 184. Protection layer 186 is formed from stainless steel, e.g., SUS304, in one embodiment. In other embodiments, protection layer 186 is an insulating layer, e.g., polyimide or polybenzoxazoles (PBO). Protection layer 186 helps keep portions of EMI-absorbing layer 184 from inadvertently being damaged or removed during processing. In some embodiments, protection layer 186 reflects RF signals internally so that some EMI reflected by metal bar 182 is kept within EMI-absorbing material 184 by the protection layer. Internally reflecting EMI increases absorption loss within EMI-absorbing material 184.

FIG. 2e shows EMI-absorbing metal bar 180 being disposed on substrate 152 between semiconductor die 104a and 104b. EMI-absorbing metal bar 180 and other components on substrate 152 can be mounted in any desired order in other embodiments. Contact pad 158 of conductive layer 156 is sized appropriately to mount EMI-absorbing metal bar 180 using solder reflowed between the EMI-absorbing metal bar and the contact pad. The solder can be applied to contact pad 158 or EMI-absorbing metal bar 180 as solder paste prior to mounting. EMI-absorbing metal bar 180 is positioned directly between semiconductor die 104a and 104b or other components needing protected from EMI generated by each other.

In FIG. 2f, an encapsulant or molding compound 190 is deposited over substrate 152, covering top and side surfaces of EMI-absorbing metal bar 180 and semiconductor die 104. Encapsulant 190 also extends under semiconductor die 104 between the semiconductor die and substrate 152. In other embodiments, a separate mold underfill (MUF) is used instead.

Encapsulant 190 is an electrically insulating material deposited using a paste printing, compressive molding, transfer molding, liquid encapsulant molding, vacuum lamination, spin coating, or other suitable application process. Encapsulant 190 can be polymer composite material, such as an epoxy resin, epoxy acrylate, or polymer with or without a filler. Encapsulant 190 is non-conductive and environmentally protects the semiconductor device from external elements and contaminants.

Encapsulant 190 is typically deposited with substrate 152 remaining as a larger panel with multiple SiP modules 150 being formed at once. The larger panel of substrate 152 and encapsulant 190 is then singulated into units to allow a shielding layer 196 to be formed both on the top and also the side surfaces of each SiP module 150 in FIG. 2g.

Figure 2G:
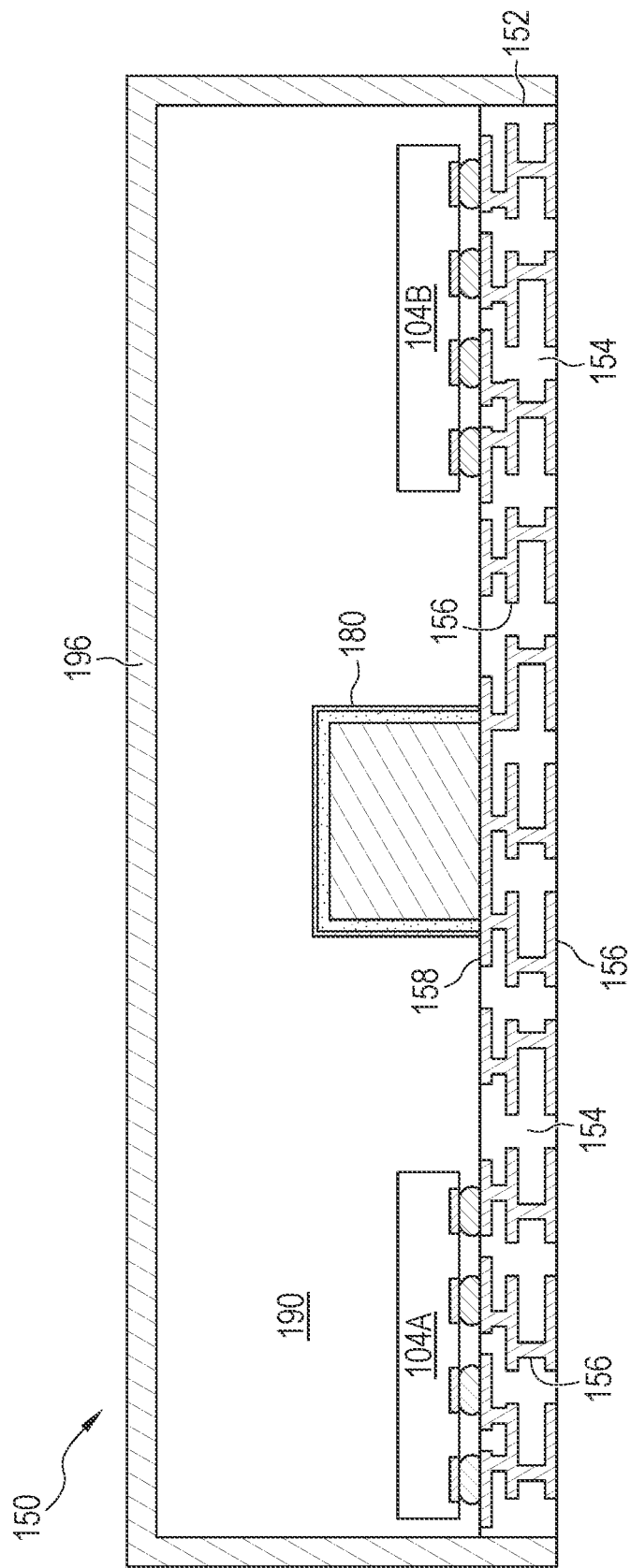

In FIG. 2g, a conductive material is sputtered over SiP module 150 to form a conductive shielding layer 196. Shielding layer 196 is formed using any suitable metal deposition technique, e.g., PVD, CVD, other sputtering methods, spraying, or plating. The sputtered material can be copper, steel, aluminum, gold, combinations thereof, or any other suitable conductive material. In some embodiments, shielding layer 196 can be made by sputtering on multiple layers of differing material, e.g., stainless steel-copper-stainless steel or titanium-copper. Shielding layer 196 reduces EMI between the components of package 150 and other nearby electronic devices. Shielding layer 196 is optionally grounded through conductive layers 156 to improve EMI reduction.

FIG. 2g shows a completed SiP module 150 with EMI-absorbing metal bar 180 for intra-package EMI reduction. SiP module 150 has a land-grid array on the bottom of substrate 152 for interconnection to a larger system. In other embodiments, further interconnect structures are applied, such as solder bumps or conductive pillars.

Metal bar 182 reduces EMI between semiconductor die 104a and 104b by being coupled to ground through contact pad 158. EMI-absorbing material 184 further reduces EMI by trapping and absorbing RF signals. EMI-absorbing material 184 reduces the amount of RF signals from each semiconductor die 104 that would otherwise reflect off of metal bar 182 back to the semiconductor die that generated the RF signals.

Figure 3A:
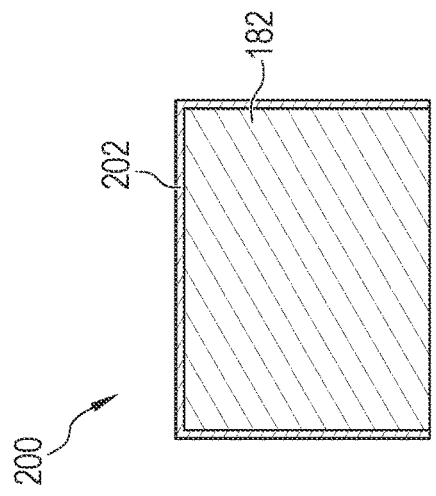
FIGS. 3a-3d illustrate an alternative EMI-absorbing coating embodiment.
Figure 3B:
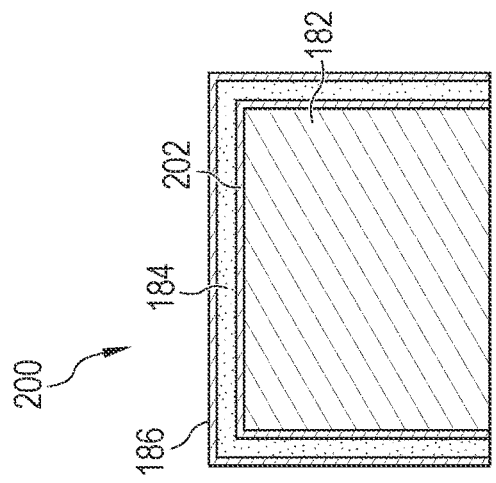
Figure 3C:
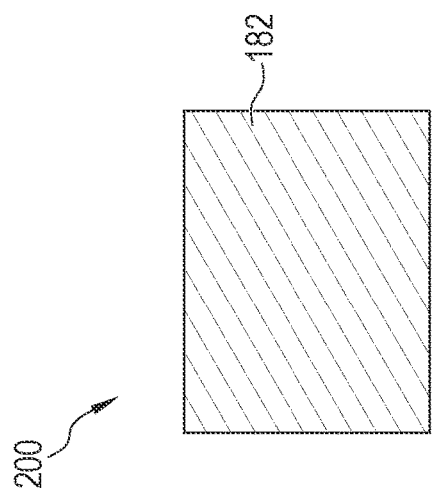
Figure 3D:
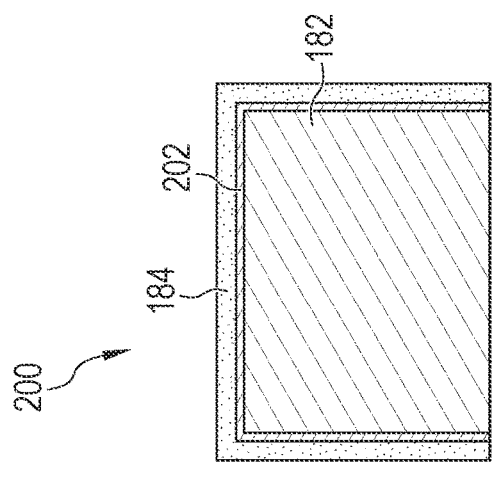

FIGS. 3a-3d show another embodiment as EMI-absorbing metal bar 200. EMI-absorbing metal bar 200 begins with a metal bar 182 in FIG. 3a, similar to above. In FIG. 3b, a seed, adhesion, or wetting layer 202 is formed over metal bar 182. Wetting layer 202 is stainless steel, e.g., SUS304, in one embodiment. In FIG. 3c, EMI-absorbing material 184 is applied onto metal bar 182 as described above, but with wetting layer 202 between the metal bar and EMI-absorbing material. Wetting layer 202 helps EMI-absorbing material 184 stick to metal bar 182. In FIG. 3d, protection layer 186 is applied over EMI-absorbing material 184 as described above. Both wetting layer 202 and protection layer 186 are optional, and other embodiments can lack either layer or both layers.

FIG. 4 illustrates another embodiment as SiP module 220. An opening or trench 222 is formed through encapsulant 190 using laser ablation, mechanical drilling, chemical etching, or another suitable means to expose a top surface of EMI-absorbing metal bar 200 or 180. In other embodiments, one or more layers are removed from the top of metal bar 182 as well. Formation of trench 222 exposes metal bar 182 in some embodiments.

Trench 222 is formed prior to formation of shielding layer 196. When shielding layer 196 is formed, a portion 224 of shielding layer 196 is formed in trench 222 on EMI-absorbing metal bar 200. Portion 224 directly connects shielding layer 196 to EMI-absorbing metal bar 200, which helps ground the EMI-absorbing metal bar and also creates additional vertical shielding along the sidewalls of trench 222.

The physical dimensions of metal bar 182 can all be adjusted as desired. For example, SiP module 230 in FIG. 5 utilizes a taller metal bar to form EMI-absorbing metal bar 232. A taller metal bar can improve performance without having the extra processing steps required to form trench 222. EMI-absorbing metal bar 232 is otherwise formed similarly to EMI-absorbing metal bars 180 and 200 above. The extra height over substrate 152 improves EMI blocking and absorbing performance by reducing the gap between the EMI-absorbing metal bar and shielding layer 196.

FIGS. 6a and 6b illustrate an embodiment as SiP module 250 where metal bar 182 is exposed by backgrinding the entire top surface of encapsulant 190 rather than by forming a trench or opening as shown in FIG. 4. In FIG. 6a, encapsulant 190 is backgrinded using a grinder 240. Chemical-mechanical planarization or any other suitable means can be used to reduce a thickness of encapsulant 190 and thereby expose metal bar 182 or one of the layers disposed thereon. Using the taller EMI-absorbing metal bar 232 reduces the amount of backgrinding that must be done, reducing manufacturing time and cost, but any of the above-described EMI-absorbing metal bars can be used. In FIG. 6b, shielding layer 196 is formed over encapsulant 190 as above, but also directly on metal bar 182.

Figure 7A:
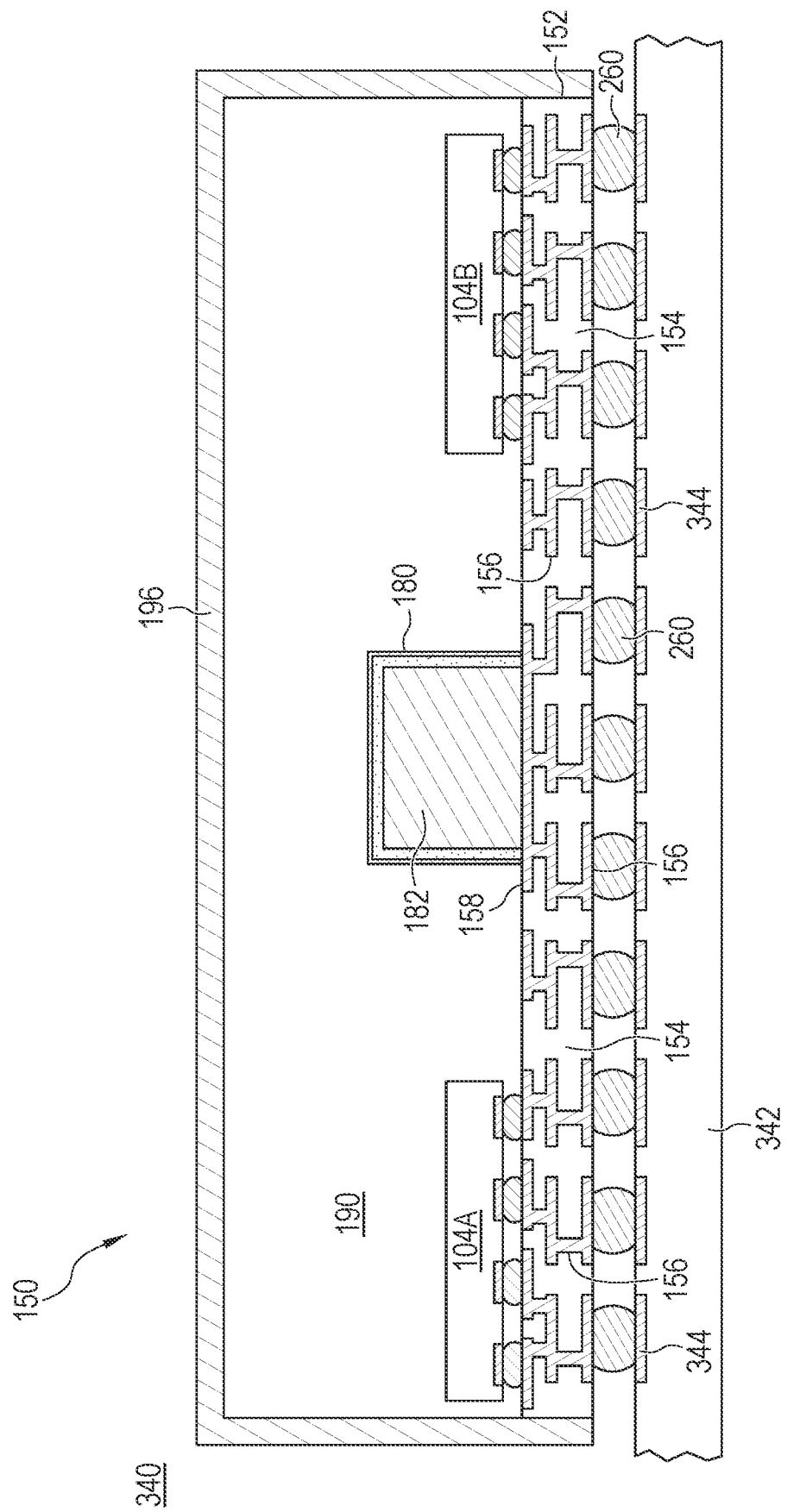
FIGS. 7a and 7b illustrate integrating the SiP module into an electronic device.
Figure 7B:
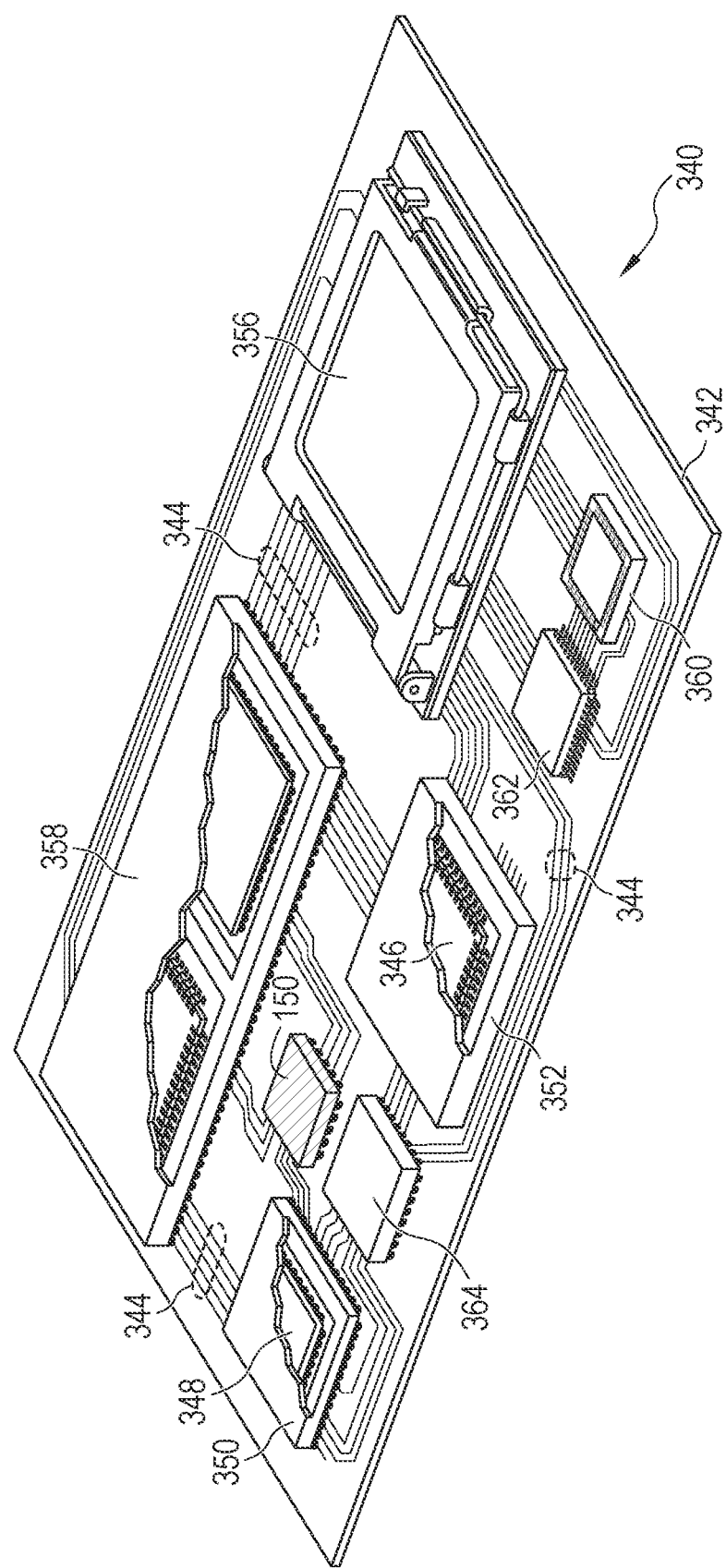

FIGS. 7a and 7b illustrate integrating the above-described semiconductor packages, e.g., SiP module 150, into a larger electronic device 340. FIG. 7a illustrates a partial cross-section of SiP module 150 mounted onto a printed circuit board (PCB) or other substrate 342 as part of electronic device 340. Bumps 260 are formed similar to the description of bumps 114 above at any desired stage of manufacture and are reflowed onto conductive layer 344 of PCB 342 to physically attach and electrically connect SiP module 150 to the PCB. In other embodiments, thermocompression or other suitable attachment and connection methods are used. In some embodiments, an adhesive or underfill layer is used between SiP module 150 and PCB 342. Semiconductor die 104 are electrically coupled to conductive layer 344 through substrate 152.

FIG. 7b illustrates electronic device 340 including PCB 342 with a plurality of semiconductor packages mounted on a surface of the PCB, including SiP module 150. Electronic device 340 can have one type of semiconductor package, or multiple types of semiconductor packages, depending on the application. Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Electronic device 340 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 7b, PCB 342 provides a general substrate for structural support and electrical interconnection of the semiconductor packages mounted on the PCB. Conductive signal traces 344 are formed over a surface or within layers of PCB 342 using evaporation, electrolytic plating, electroless plating, screen printing, or other suitable metal deposition process. Signal traces 344 provide for electrical communication between the semiconductor packages, mounted components, and other external systems or components. Traces 344 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 342. In other embodiments, a semiconductor device may only have the first level packaging where the die is mechanically and electrically mounted directly to PCB 342.

For the purpose of illustration, several types of first level packaging, including bond wire package 346 and flipchip 348, are shown on PCB 342. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 342 along with SiP module 150. Conductive traces 344 electrically couple the various packages and components disposed on PCB 342 to SiP module 150, giving use of the components within SiP module 150 to other components on the PCB.

Depending upon the system requirements, any combination of semiconductor packages, configured with any combination of first and second level packaging styles, as well as other electronic components, can be connected to PCB 342. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a substrate;
disposing a first semiconductor die and second semiconductor die over the substrate;
providing a metal bar;
disposing an EMI-absorbing material over the metal bar;
disposing the metal bar over the substrate between the first semiconductor die and second semiconductor die after disposing the EMI-absorbing material over the metal bar;
depositing an encapsulant over the first semiconductor die, second semiconductor die, and metal bar; and
forming a shielding layer over the encapsulant.

2. The method of claim 1, further including forming a trench in the encapsulant prior to forming the shielding layer.

3. The method of claim 1, further including forming a protection layer over the EMI-absorbing material.

4. The method of claim 1, further including forming a wetting layer between the metal bar and EMI-absorbing material.

5. The method of claim 1, wherein the EMI-absorbing material includes nickel.

6. The method of claim 1, wherein the EMI-absorbing material includes a polymeric base and magnetic metal flakes disposed in the polymeric base.

7. The method of claim 1, wherein the shielding layer physically contacts the metal bar.

8. A method of making a semiconductor device, comprising:
providing a substrate;
disposing a first electronic component and second electronic component over the substrate;
providing a metal bar;
disposing an EMI-absorbing material over the metal bar to form an EMI-absorbing metal bar; and
disposing the metal bar over the substrate between the first electronic component and second electronic component after disposing the EMI-absorbing material over the metal bar.

9. The method of claim 8, further including forming a shielding layer over the first electronic component, second electronic component, and EMI-absorbing metal bar.

10. The method of claim 9, wherein the shielding layer physically contacts the EMI-absorbing metal bar.

11. The method of claim 8, further including forming a protection layer over the EMI-absorbing material.

12. The method of claim 11, further including forming a wetting layer between the metal bar and EMI-absorbing material.

13. The method of claim 12, wherein the protection layer and wetting layer both include stainless steel.

14. The method of claim 8, wherein the EMI-absorbing material includes nickel.

15. The method of claim 8, further including:
   depositing an encapsulant over the substrate, metal bar, and EMI-absorbing material; and
   forming a shielding layer over the encapsulant.

16. A method of making a semiconductor device, comprising:
   providing a substrate;
   providing a metal bar;
   disposing an EMI-absorbing material over the metal bar to form an EMI-absorbing metal bar; and
   disposing the metal bar over the substrate after disposing the EMI-absorbing material over the metal bar.

17. The method of claim 16, further including:
   depositing an encapsulant over the EMI-absorbing metal bar and substrate; and
   forming a shielding layer over the encapsulant.

18. The method of claim 17, wherein the shielding layer physically contacts the EMI-absorbing metal bar.

19. The method of claim 16, further including forming a protection layer over the EMI-absorbing material.

20. The method of claim 19, further including forming a wetting layer between the metal bar and EMI- absorbing material.

21. The method of claim 16, wherein the EMI-absorbing material includes nickel.

* * * * *